United States Patent
Lin et al.

(10) Patent No.: US 7,002,997 B2
(45) Date of Patent: Feb. 21, 2006

(54) INTERPOLATION FILTER STRUCTURE

(75) Inventors: Yu-Cheng Lin, Taipei (TW); Jyh-Huei Guo, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 1079 days.

(21) Appl. No.: 09/927,646

(22) Filed: Aug. 10, 2001

(65) Prior Publication Data

US 2003/0002542 A1    Jan. 2, 2003

(30) Foreign Application Priority Data

Jun. 22, 2001    (TW) ................ 90115215 A

(51) Int. Cl.
*G06F 1/02*    (2006.01)
*H04J 3/02*    (2006.01)

(52) U.S. Cl. ..................... 370/516; 708/290

(58) Field of Classification Search ............... 370/498, 370/503, 516, 517, 537, 545; 708/200, 290, 708/300, 313

See application file for complete search history.

(56) References Cited

U.S. PATENT DOCUMENTS 5,694,345 A * 12/1997 Peterson .................. 708/290
6,208,671 B1 * 3/2001 Paulos et al. ............. 370/545

* cited by examiner

*Primary Examiner*—Chi Pham
*Assistant Examiner*—Derrick W Ferris
(74) *Attorney, Agent, or Firm*—J.C. Patents

(57) ABSTRACT

An interpolation filter having a first gain multiplexer, a second gain multiplexer, an adder and a multiplexer. The interpolation filter uses neighboring input discrete-time signals to generate interpolation signals having the desired sampling rate.

5 Claims, 6 Drawing Sheets

```
{ INTERPOLATE.dsp
Real time Direct Form Filter, N taps, uses an efficient algorthm
to interpolate by L for an increase of L times the input sample rate. A
restriction on the number of taps that N/L be integer.

INPUT: adc
    OUTPUT: dac

}

MODULE/RAM/ABS=0    interpolate;
.CONST              N=300;
.CONST              L=4;                { interpolate by factor of L }
.CONST              NoverL=75;
.VAR/PM/RAM/CIRC    coef[N];
.VAR/PM/RAM/CIRC    data[NoverL];
.VAR/PM/RAM/        counter;
.PORT               adc;
.PORT               adc;
.INIT               coef: <coef.dat>;

RTI;                {interrupt 0 }
            RTI;                {interrupt·1 }
            RTI;                {interrupt 2 }
            JUMP sample;        {interrupt 3 at (L*input rate) } initialize:  IMASK=b#0000;      {disable all interrupts}
             ICNTL=b#01111;     {edge sensitive interrupts}
             SI=1;              {set interpolate counter to 1}
             DM(counter0=SI;    {for first data sample}
             I4=^coef;          {setup a circular buffer in PM}
             L4=%coef;

(listing contiunes on nest page)
```

FIG. 4 (PRIOR ART)

```
               M4=L;              {modifier for coef is L}
               M5=-1;             {modifier to shift coef back -1}
               I0=^data;          {setup circular buffer in DM}
               L0=%data;
               M0=1
               IMASK=B#1000;      {enable interrupt 3}
wait_interrupt: JUMP wait_interrupt;{infinte wait loop}

{_____Interpolate_____}
sample:        MODIFY(I4,M5);     {shifts coef pointer back by -1}
               AY0=DM(counter);
               AR=AY0-1;          {decrement and update counter}
               DM(counter)=AR;
               IF NE JUMP do_fir; {test ont input if L times}

{____input data sample, code executed at the sample rate_____}
do_input:      AY0=DM(adc);       {input data sample}
               DM(I10,M0)=AY0;    {update delay line wiht newest}
               MODIFY(I4,M4);     {shifts coef pointer up by L}
               DM(counter)=M4;    {reset counter to L}

{____filter pass, occurs at L times the input sample rate _____}
do_fir:        CNTR=NOVERL -1;    {N/L since round on last tap}
               MR=0, MX0=DM(I0,M0); MY0=PM(I4,M4);
               DO toploop UNTIL CE; {N/L-1 taps of FIR}
toploop:          MR=MR+MX0*MX0(SS), MX0=DM(I0,M0), MY0=PM(I4,M4);
               IF MV SAT MR;      {saturate result if overflowed}
               DM(dac)=MR1;       {output sample}
               RTI;
ENDMOD:
```

FIG. 4 (PRIOR ART)
(CONTINUED)

INTERPOLATION FILTER STRUCTURE

CROSS-REFERENCE TO RELATED APPLICATION

This application claims the priority benefit of Taiwan application serial no. 90115215, filed Jun. 22, 2001.

BACKGROUND OF THE INVENTION

1. Field of Invention

The present invention relates to an interpolation filter. More particularly, the present invention relates to an interpolation filter that utilizes a microprocessor to generate interpolation signals.

2. Description of Related Art

Multi-rate filters are widely adopted inside digital audio systems such as compact disks and digital audio tape players. These filters convert a set of input samples into another set of data, which represents the sampling of identical analogue signals at different rates. The two principal implementations of a multi-rate filter are decimation and interpolation. In the interpolation, existing data are computed to increase sampling rate and fill in the missing data between signal samples.

The process of converting from a discrete-time signal to a continuous-time signal is called a reconstruction. The interpolation method can be regarded as a reconstruction from another discrete-time signal to a continuous-time signal. The reconstruction of continuous-time (analogue) signal and the reconstruction of the discrete-time (digital) signal are both processes of turning the same into analogue signal. FIG. 1 is a diagram showing a conventional method of reconstructing a continuous-time signal. As shown in FIG. 1, the continuous discrete-time signal x(n) consists of an impulse train. The amplitude of this impulse train corresponds to the sample x(n) at time nT. In practice, this type of conversion is actually implemented by a digital/analogue converter and the results of the conversion are a continuous signal y(t). To smooth out the continuous signal y(t) and produce a reconstructed analogue signal $x_c(t)$, a low-pass reconstruction filter is often used.

FIG. 2 is a diagram showing the discrete-time signal obtained by a conventional interpolation method. As shown in FIG. 2, the discrete-time signal x(n) is a multiple of L=4. Within the discrete-time signal x(n) are L-1 zero value sampling points. A signal w(m) is obtained by inserting these zero value points. A smooth signal y(m) is derived after passing the signal w(m) through a low-pass filter. Since one x(n) sample corresponds to L y(m) samples, the sampling rate increases L times.

The interpolation low-pass filter has a finite impulse response (FIR) structure (alternatively, an infinite impulse response (IIR) structure). The signal y(m) computed by the convolution equation of a filter is as follows:

$$y(m) = \sum_{k=0}^{N-1} h(k)w(m-k);$$

where h(k) an impulse function, N-1 is the number of filter coefficient in the impulse function h(k), w(m−k) is an expansion formula according to an input signal x(n) ratio, and the relationship between the signal w(m−k) and the signal x(n) is given by:

$w(m-k)=x(m-k)/L$ when $m=k=0$, $\pm L$, $\pm 2L$, ...; and
$w(m-k)=0$, for others.

FIG. 3 is a block diagram showing the internal architecture of a conventional interpolation filter. As shown in FIG. 3, the function of an FIR filter (or an IIR filter) is implemented using a microprocessor 302 (in FIG. 3, the microprocessor is labeled ADSP-2100) and its associated assembly language. When the IRQ terminal of the microprocessor 302 receives a signal from a timer 304, the microprocessor 302 executes to filter an input discrete-time signal submitted from an analogue/digital converter 306. Furthermore, the microprocessor 302 uses a software program (for example, such as the one shown in FIG. 4) to produce the interpolation signal having the desired sampling rate. Finally, the interpolation signal is transmitted to a latching circuit 308.

The microprocessor must hold the filter coefficient and the input signal in order to carry out any interpolation filter function. Moreover, the microprocessor must compute the interpolation signal according to the sampling rate. If the sampling rate is high, time required for calculating the interpolation signal is longer. Because both data transfer and signal computation use up some microprocessor's processing time (in other words, instruction cycles), other tasks are forced to slow down.

SUMMARY OF THE INVENTION

Accordingly, one object of the present invention is to provide an interpolation filter structure that uses neighboring input discrete-time signals to generate interpolation signals having a desired sampling rate without any data transfer and signal calculation by a microprocessor. Hence, some microprocessor instruction cycles are saved.

To achieve these and other advantages and in accordance with the purpose of the invention, as embodied and broadly described herein, the invention provides an interpolation filter structure. The structure includes a first gain multiplexer, a second gain multiplexer, an adder and a multiplexer. The first gain multiplexer receives a control signal, a previous discrete-time signal and a current discrete-time signal. The first gain multiplexer selects the previous discrete-time signal or the current discrete-time signal according to the control signal and performs a multiplication computation with a first gain value to produce a first gain signal. The second gain multiplexer receives a control signal, a previous discrete-time signal and a current discrete-time signal. The second gain multiplexer selects the previous discrete-time signal or the current discrete-time signal according to the control signal and performs a multiplication computation with a second gain value to produce a second gain signal. The adder adds together the first gain signal and the second gain signal to produce an add signal. The multiplexer receives the control signal, the previous discrete-time signal and the add signal. According to the control signal, the previous discrete-time signal or the add signal is selected to serve as a discrete-time interpolation signal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4 is a program listing showing steps for operating a conventional interpolation filter;

DESCRIPTION OF THE PREFERRED EMBODIMENTS

Figure 1:
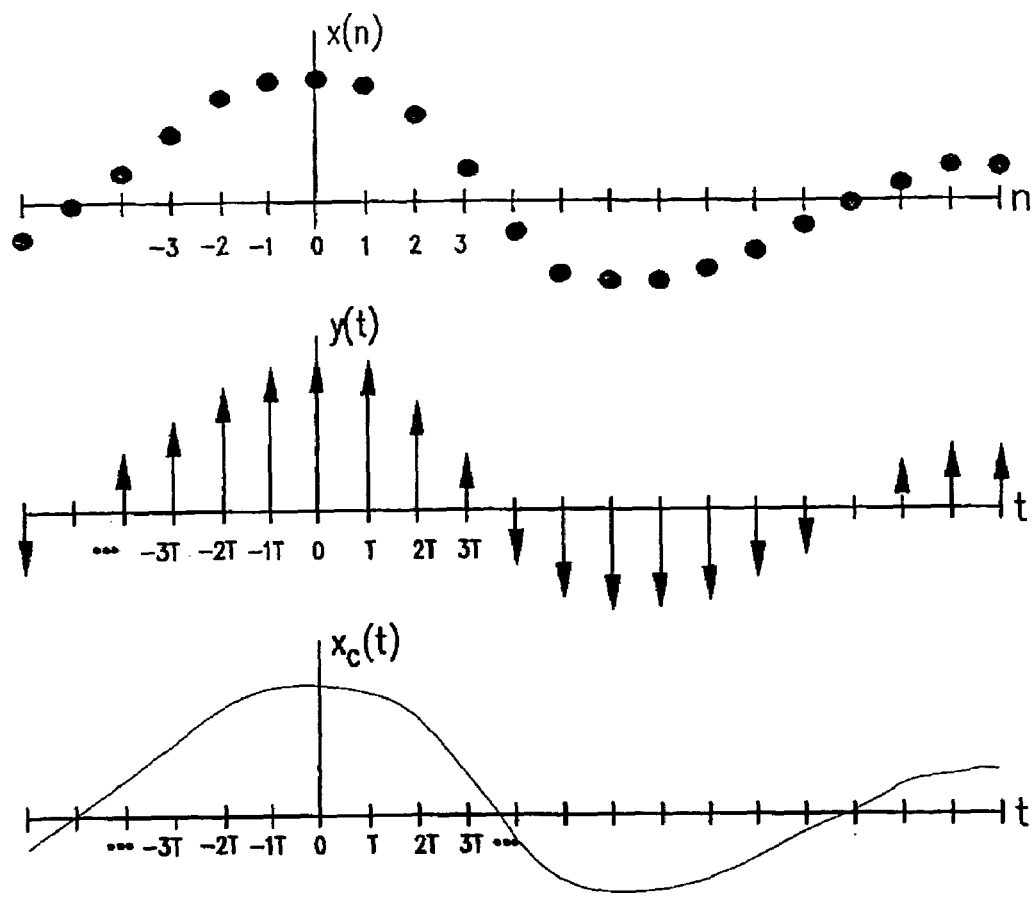
FIG. 1 is a diagram showing a conventional method of reconstructing a continuous-time signal.
Figure 2:
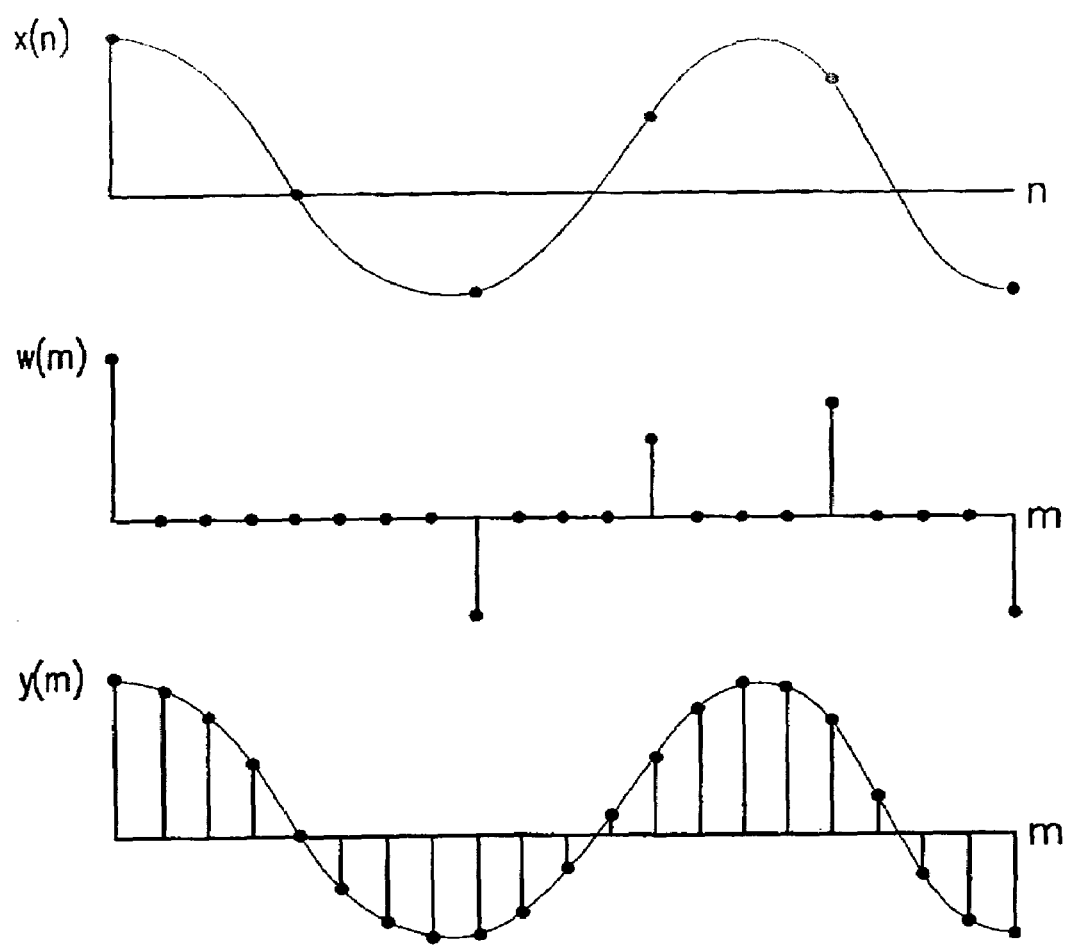
FIG. 2 is a diagram showing the discrete-time signal obtained by a conventional interpolation method.
Figure 3:
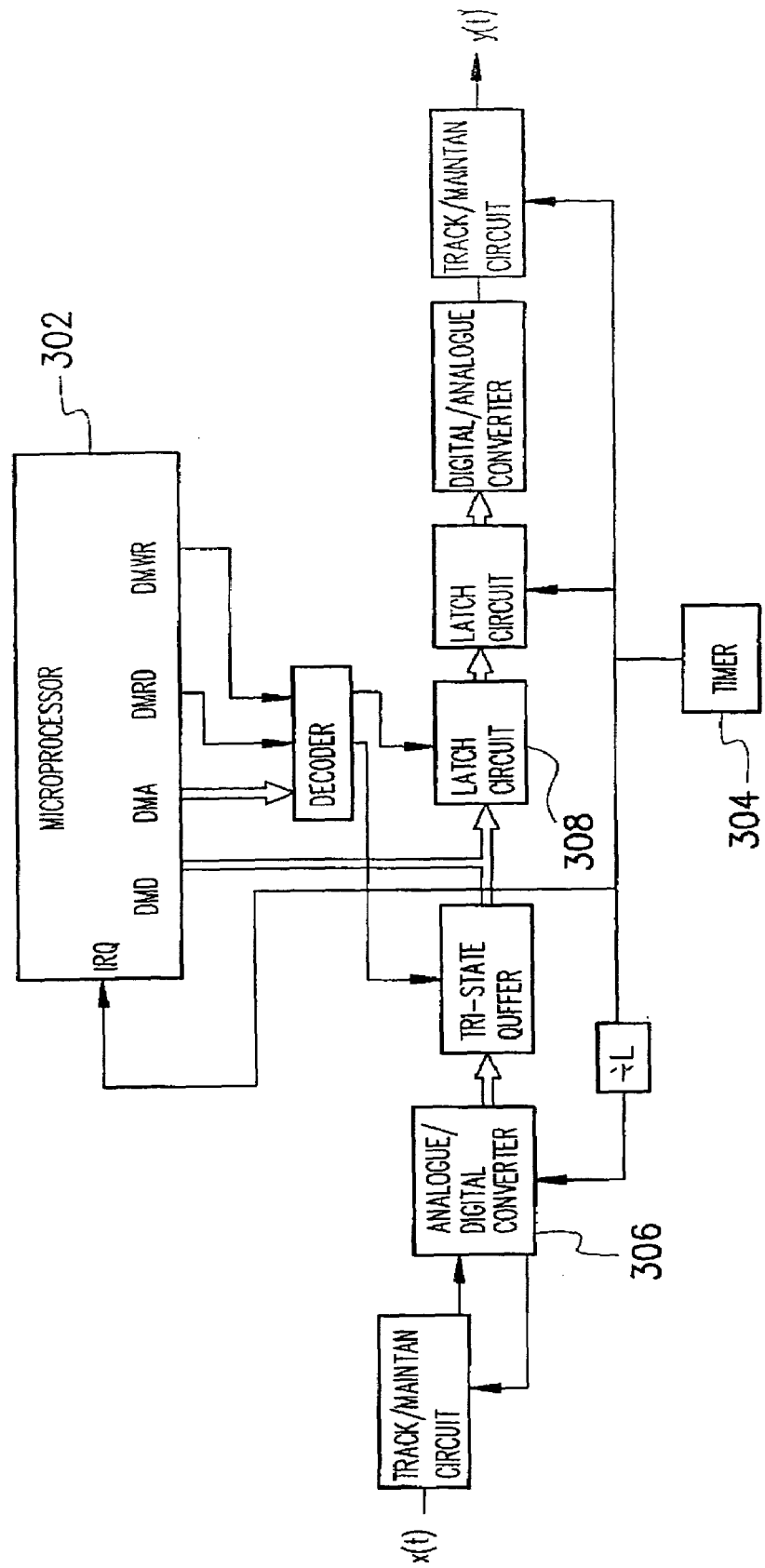
FIG. 3 is a block diagram showing the internal architecture of a conventional interpolation filter.

Reference will now be made in detail to the present preferred embodiments of the invention, examples of which are illustrated in the accompanying drawings. Wherever possible, the same reference numbers are used in the drawings and the description to refer to the same or like parts.

The interpolation filter of this embodiment completes a total of three interpolation calculations within a system clocking cycle. Before conducting an interpolation calculation, the sampling signal is a discrete-time signal X[n] that has a sampling rate of Fs. After an interpolation calculation, the sampling signal is a discrete-time signal Y[n] that has a sampling rate of Fs'. The sampling rates Fs and Fs' are related by Fs'=3*Fs. Furthermore, the discrete-time signal X[n] and the discrete-time signal Y[n] are related by the following equations:

$$Y[3k]=X[k-1];$$

$$Y[3k+1]=0.75*X[k-1]+0.25*X[k];$$

$$Y[3k+2]=0.75*X[k]+0.25*X[k-1]$$

where k is an integer.

Figure 5:
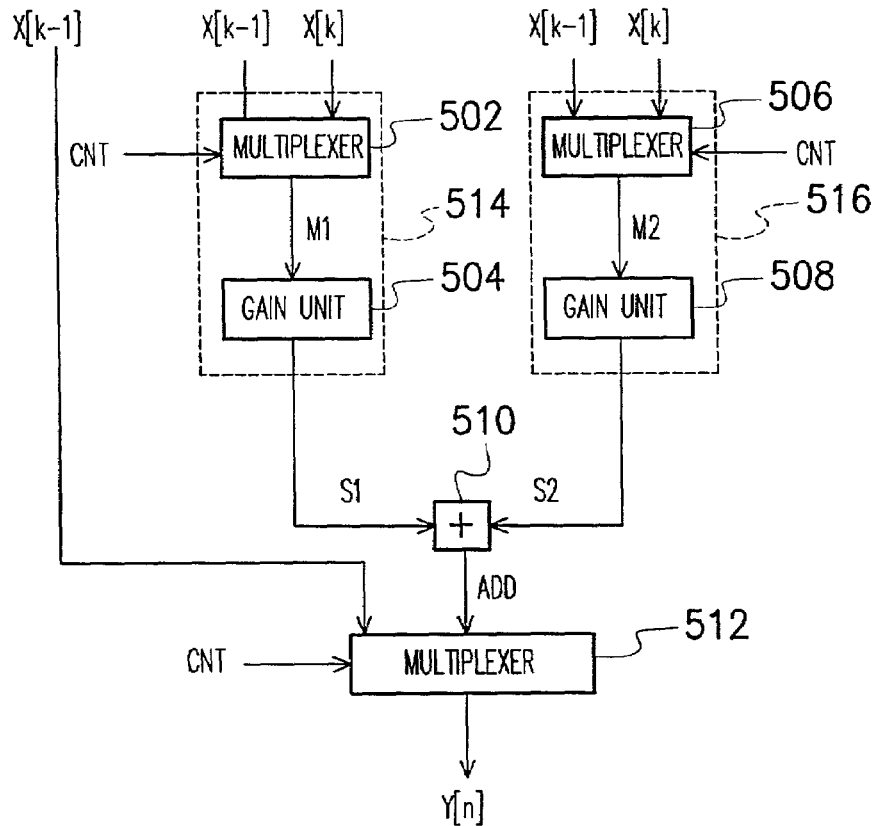
FIG. 5 is a block diagram showing the internal architecture of an interpolation filter according to this invention.

FIG. 5 is a block diagram showing the internal architecture of an interpolation filter according to this invention. The system implements the mathematical function between the aforementioned discrete-time signals X[n] and Y[n] so that a multi-rate filter is produced. The system includes a first gain multiplexer 514, a second gain multiplexer 516, an adder 510 and a multiplexer 512. In FIG. 5, a counter (not part of the interpolation filter, hence not shown) produces the necessary control signal CNT. The control signal CNT provided by the counter (not shown) has a sampling cycle of 1/Fs. The counter starts counting from 1 to 2 to 3 and then back again to one in cycles.

The first gain multiplexer 514 comprises a multiplexer 502 and a gain unit 504. Similarly, the second gain multiplexer 516 comprises a multiplexer 506 and a gain unit 508. The input terminals of the multiplexer 502 receive the discrete-time signals X[k-1] and X[k], respectively. If the control signal CNT received by the multiplexer 502 is one, the multiplexer 502 outputs the discrete-time signal X[k-1] to serve as a signal M1. On the other hand, if the control signal CNT received by the multiplexer 502 is two, the multiplexer 502 output the discrete-time signal X[k] to serve as the signal M1. The gain unit 504 picks up the signal M1 from the multiplexer 502 and multiplies the signal M1 by a gain value to produce a gain signal S1. Thereafter, the gain signal S1 is transmitted from the gain unit 504 to the adder 510. Here, the gain value is 0.75.

The input terminals of the multiplexer 506 receive the discrete-time signals X[k-1] and X[k], respectively. If the control signal CNT received by the multiplexer 506 is one, the multiplexer 506 outputs the discrete-time signal X[k] to serve as a signal M2. On the other hand, if the control signal CNT received by the multiplexer 506 is two, the multiplexer 506 output the discrete-time signal X[k-1] to serve as the signal M2. The gain unit 508 picks up the signal M2 from the multiplexer 506 and multiplies the signal M2 by a gain value to produce a gain signal S2. Thereafter, the gain signal S2 is transmitted from the gain unit 508 to the adder 510. Here, the gain value is 0.25.

The adder 510 performs an addition of the gain signal S1 submitted by the gain unit 504 and the gain signal S2 submitted by the gain unit 508 to produce an add signal (ADD). The ADD signal is transmitted from the adder 510 to the multiplexer 512. One input terminal of the multiplexer 512 receives the ADD signal from the adder 510 while the other input terminal of the multiplexer 512 receives the discrete-time signal X[k-1]. If the multiplexer 512 receives a control signal CNT equal to 1 or 2, the multiplexer 512 outputs the ADD signal. The output ADD signal is the interpolation discrete-time signal Y[n]. If the multiplexer 512 receives a control signal CNT equal to 3, the multiplexer 512 outputs a discrete-time signal X[k-1]. The output discrete-time signal X[k-1] is the interpolation discrete-time signal Y[n].

Consequently, the relationship between the aforementioned discrete-time signal X[n] and interpolation discrete-time signal Y[n] can be summarized as:

$$Y[n]=Y[3k]=X[k-1] \text{ when CNT=3};$$

$$Y[n]=Y[3k+1]=0.75*X[k-1]+0.25*X[k] \quad \text{when CNT=1};$$

$$Y[n]=Y[3k+2]=0.75*X[k]+0.25*X[k-1] \text{ when CNT=2}$$

Figure 6:
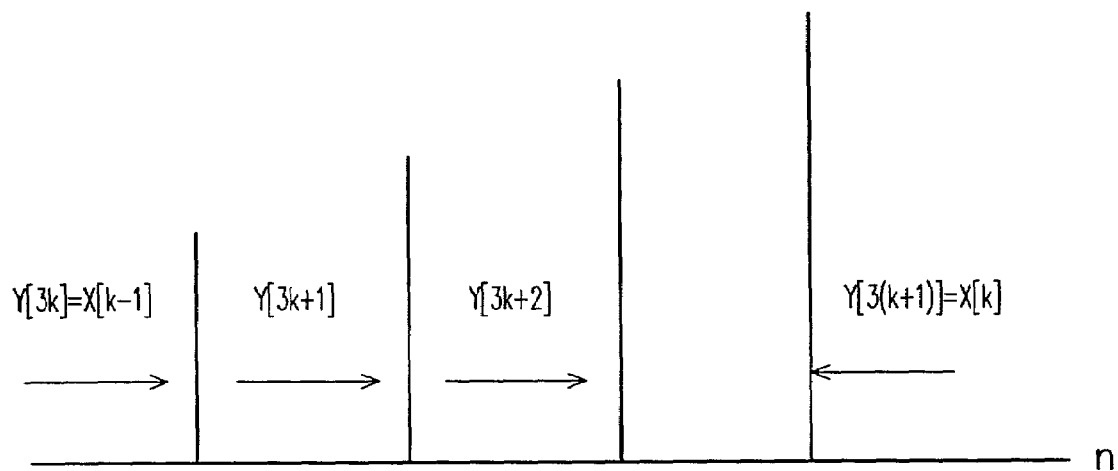
FIG. 6 is a diagram showing the discrete-time signals after interpolation according to this invention.

Hence, according to the hardware structure shown in FIG. 5, three interpolated results are obtained, namely: Y[3k], Y[3k+1] and Y[3k+2]. FIG. 6 is a diagram showing the discrete-time signals after interpolation according to this invention.

In conclusion, this invention provides an interpolation filter structure that uses neighboring input discrete-time signals to generate interpolation signals having a desired sampling rate without any data transfer and signal calculation by a microprocessor. Hence, some microprocessor instruction cycles are saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interpolation filter structure, comprising:
   a first gain multiplexer for receiving a control signal, a previous discrete-time signal and a current discrete-time signal and selecting either the previous discrete-time signal or the current discrete-time signal according to the control signal to multiply by a first gain value and produce a first gain signal;
   a second gain multiplexer for receiving the control signal, the previous discrete-time signal and the current discrete-time signal and selecting either the previous discrete-time signal or the current discrete-time signal according to the control signal to multiply by a second gain value and produce a second gain signal;

an adder for adding together the first gain signal and the second gain signal to produce an add signal; and a multiplexer for receiving the control signal, the previous discrete-time signal and the add signal and selecting either the previous discrete-time signal or the add signal to serve as a discrete-time interpolation signal.

2. The interpolation filter structure of claim 1, wherein the first gain multiplexer further includes:

a first multiplexer for receiving the control signal, the previous discrete-time signal and the current discrete-time signal and selecting either the previous discrete-time signal or the current discrete-time signal according to the control signal to produce a first multiplexer signal; and a first gain unit for multiplying the first multiplexer signal by the first gain value to produce the first gain signal.

3. The interpolation filter structure of claim 2, wherein the first gain unit provides a first gain value of about 0.75.

4. The interpolation filter structure of claim 1, wherein the second gain multiplexer further includes:

a second multiplexer for receiving the control signal, the previous discrete-time signal and the current discrete-time signal and selecting either the previous discrete-time signal or the current discrete-time signal according to the control signal to produce a second multiplexer signal; and a first gain unit for multiplying the second multiplexer signal by the second gain value to produce the second gain signal.

5. The interpolation filter structure of claim 4, wherein the second gain unit provides a second gain value of about 0.25.

\* \* \* \* \*